(12) United States Patent
Inomata et al.

(10) Patent No.: US 7,371,500 B2
(45) Date of Patent: May 13, 2008

(54) POSITIVE PHOTOSENSITIVE INSULATING RESIN COMPOSITION AND CURED PRODUCT THEREOF

(75) Inventors: Katsumi Inomata, Tokyo (JP); Takashi Nishioka, Tokyo (JP); Atsushi Itou, Tokyo (JP); Masayoshi Suzuki, Tokyo (JP); Shin-ichirou Iwanaga, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/692,486

(22) Filed: Mar. 28, 2007

(65) Prior Publication Data

US 2007/0166632 A1   Jul. 19, 2007

Related U.S. Application Data

(62) Division of application No. 10/475,084, filed as application No. PCT/JP03/00260 on Jan. 15, 2003, now Pat. No. 7,214,454.

(30) Foreign Application Priority Data

Jan. 23, 2002  (JP) .............................. 2002-14307
Jan. 28, 2002  (JP) .............................. 2002-18390

(51) Int. Cl.
   *G03F 7/023*   (2006.01)
(52) U.S. Cl. ............... 430/191; 430/192; 430/193; 430/270.1; 430/280.1
(58) Field of Classification Search ........... 430/191, 430/192, 193, 270.1, 280.1
See application file for complete search history.

(56) References Cited

U.S. PATENT DOCUMENTS

| 4,873,176 | A | 10/1989 | Fisher ..................... 430/313 |
| 5,432,039 | A | 7/1995 | Shimokawa et al. ........ 430/191 |
| 5,691,101 | A | 11/1997 | Ushirogouchi et al. ..... 430/176 |
| 6,190,833 | B1 | 2/2001 | Shiota et al. ............ 430/280.1 |
| 6,340,552 | B1 * | 1/2002 | Kihara et al. ............ 430/270.1 |
| 6,653,043 | B1 | 11/2003 | Hanabata ................. 430/270.1 |
| 7,015,256 | B2 | 3/2006 | Ito et al. ................. 430/193 |
| 2004/0094752 | A1 | 5/2004 | Ito et al. ................. 252/578 |
| 2004/0110084 | A1 | 6/2004 | Inomata et al. .......... 430/270.1 |

FOREIGN PATENT DOCUMENTS

| EP | 859282 | 8/1998 |
| EP | 933681 | 8/1999 |
| EP | 2001-5175 | 1/2001 |
| JP | 6-201901 | 7/1994 |
| JP | 2001-240757 | 9/2001 |
| JP | 2002-258479 | 9/2002 |

* cited by examiner

*Primary Examiner*—John S. Chu
(74) *Attorney, Agent, or Firm*—Oblon, Spivak, McClelland, Maier & Neustadt, P.C.

(57) ABSTRACT

Positive photosensitive insulating resin compositions of the invention contain at least (A) an alkali soluble resin having a phenolic hydroxyl group, (B) a compound having a quinonediazido group, (C) crosslinked fine particles, (D) a compound containing at least two alkyletherified amino groups in the molecule, and (F) a solvent The resin compositions have excellent resolution, electrical insulating properties and thermal shock properties. Cured products of the invention are obtained by curing these resin compositions, and they show good adhesive properties.

12 Claims, 1 Drawing Sheet

POSITIVE PHOTOSENSITIVE INSULATING RESIN COMPOSITION AND CURED PRODUCT THEREOF

This application is a Divisional application of U.S. application Ser. No. 10/475,084, now U.S. Pat. No. 7,214,454, filed Oct. 10, 2003 which is a 371 of International Application PCT/JP03/00260, filed on Jan. 15, 2003.

FIELD OF THE INVENTION

The present invention relates to a positive photosensitive insulating resin composition for the production of interlayer insulation films (passivation films), surface protection films (overcoat films) or insulating films for high density mounting board, etc. It also relates to a cured product of the composition. More particularly, the invention relates to a positive photosensitive insulating resin composition which is a resist for permanent films having a good resolution and can be cured to give a product that is excellent in properties such as electrical insulating properties, thermal shock properties and adhesive properties; the invention also relates to such a cured product produced from the composition.

BACKGROUND OF THE INVENTION

Polyimide resins, which have excellent heat resistance and mechanical properties, are widely used in the production of interlayer insulation films and surface protection films for semiconductor elements of electronic devices. To improve the productivity and accuracy in forming those films, various studies have been conducted to impart a good photosensitivity to the polyimide resins, i.e. photosensitive polyimide resins. For example, negative photosensitive polyimide resins have been in practical use. Those are prepared by introducing a photo-crosslinkable group into a polyimide precursor through an ester linkage or an ionic bond. In respect to positive ones, JP-A-5(1993)-5996 and JP-A-2000-98601 disclose compositions that comprise a polyimide precursor and an orthoquinonediazide compound. However, the negative ones have problems in resolution and in forming films, and the positive ones in heat resistance, electrical insulating properties and adhesive properties with respect to substrates. Although there are many other patent applications in this field, they are not a complete solution for meeting the requirements that come from the trends of semiconductor elements toward high integration and small thickness. Further, the current resin compositions still have drawbacks; for example, the curing thereof causes thickness reduction (volume shrinkage) and involves multistage baking and atmosphere control. With such problems, it has been pointed out that these resin compositions are not beneficial to use in industrial production.

OBJECT OF THE INVENTION

The invention aims to solve the aforesaid problems of the prior art. Thus, it is an object of the invention to provide a positive photosensitive insulating resin composition that has a good resolution and can be cured to give a product with excellent properties, such as electrical insulating, thermal shock and adhesive properties. This cured product is suitably used in applications as interlayer insulation films, surface protection films, etc. for semiconductor elements.

It is another object of the invention to provide such a cured product obtained by the curing of the above composition.

DISCLOSURE OF THE INVENTION

The present inventors earnestly studied with a view toward solving the above problems. As a result, they have found positive photosensitive insulating resin compositions with excellent properties.

A first positive photosensitive insulating resin composition according to the invention comprises:

(A) an alkali soluble resin having a phenolic hydroxyl group, (B) a compound having a quinonediazido group, (C) crosslinked fine particles, (D) a compound containing at least two alkyletherified amino groups in the molecule, and (F) a solvent.

Preferably, the first resin composition contains on the basis of 100 parts by weight of the alkali soluble resin having a phenolic hydroxyl group (A):

the compound having a quinonediazido group (B) at 10 to 50 parts by weight, the crosslinked fine particles (C) at 1 to 50 parts by weight, and the compound containing at least two alkyletherified amino groups in the molecule (D) at 1 to 100 parts by weight.

A second positive photosensitive insulating resin composition comprises:

(A) an alkali soluble resin having a phenolic hydroxyl group, (B) a compound having quinonediazido group, (C) crosslinked fine particles, (D) a compound containing at least two alkyletherified amino groups in the molecule, (E) a thermal acid generator, and (F) a solvent.

Preferably, the second resin composition contains on the basis of 100 parts by weight of the alkali soluble resin having a phenolic hydroxyl group (A):

the compound having quinonediazido group (B) at 10 to 50 parts by weight, the crosslinked fine particles (C) at 1 to 50 parts by weight, the compound containing at least two alkyletherified amino groups in the molecule (D) at 1 to 100 parts by weight, and the thermal acid generator (E) at 0.1 to 10 parts by weight.

In these resin compositions, the crosslinked fine particles (C) preferably have a mean particle diameter of 30 to 500 nm.

Cured products of the invention can be obtained by curing these positive photosensitive insulating resin compositions.

1 . . . evaluation substrate

2 . . . substrate

3 . . . copper foil

PREFERRED EMBODIMENTS OF THE INVENTION

Figure 1:
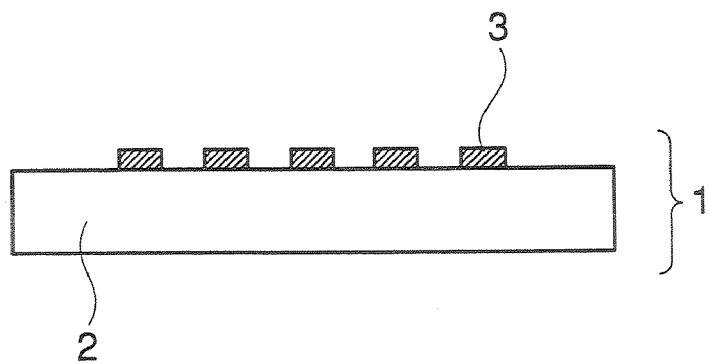
FIG. 1 is a sectional view of an evaluation sample for testing the thermal shock properties.

Hereinbelow, the positive photosensitive insulating resin compositions and the cured products thereof will be described in detail.

Positive Photosensitive Insulating Resin Compositions

The first resin composition comprises:
(A) an alkali soluble resin having a phenolic hydroxyl group,
(B) a compound having a quinonediazido group,
(C) crosslinked fine particles,
(D) a compound containing at least two alkyletherified amino groups in the molecule, and
(F) a solvent.

The second resin composition comprises:
(A) an alkali soluble resin having a phenolic hydroxyl group,
(B) a compound having a quinonediazido group,
(C) crosslinked fine particles,
(D) a compound containing at least two alkyletherified amino groups in the molecule,
(E) a thermal acid generator, and
(F) a solvent.

These compositions may optionally contain another additive such as an epoxy compound, an adhesion auxiliary or a leveling agent.

(A) Alkali Soluble Resin having Phenolic Hydroxyl Group:

The alkali soluble resin having a phenolic hydroxyl group (A) (hereinafter referred to as the "phenolic resin (A)") for use in the invention is preferably a novolak resin but is not particularly limited thereto. The novolak resin can be obtained by condensing a phenol and an aldehyde in the presence of a catalyst.

Employable phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol.

Exemplary aldehydes include formaldehyde, paraformaldehyde, acetaldehyde and benzaldehyde. Specific examples of the novolak resins include phenol/formaldehyde condensate novolak resins, cresol/formaldehyde condensate novolak resins and phenol-naphthol/formaldehyde condensate novolak resins.

The phenolic resins (A) other than the novolak resins include polyhydroxystyrene, copolymers thereof, phenol/xylyleneglycol condensate resins, cresol/xylyleneglycol condensate resins and phenol/dicyclopentadiene condensate resins.

In the invention, a low-molecular-weight phenolic compound (hereinafter referred to as the "phenolic compound (a)") other than the above phenolic resin (A) may be used together with the phenolic resin (A). Exemplary phenolic compounds (a) include 4,4'-dihydroxydiphenylmethane, 4,4'-dihydroxydiphenylether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, and 1,1,2,2-tetra(4-hydroxyphenyl)ethane. Preferably, the phenolic compound (a) is contained at 0 to 40 wt %, more preferably 0 to 30 wt %, and particularly preferably 5 to 20 wt % based on the total amount of the phenolic resin (A) and the phenolic compound (a).

It is necessary that the phenolic resin (A) have a weight-average molecular weight of at least 2,000, particularly from 2,000 to about 20,000, in consideration of resolution, thermal shock properties and heat resistance of the resulting insulating film The resin compositions preferably contain the phenolic resin (A) (and the phenolic compound (a) when it is used in combination) at 30 to 90 wt %, more preferably 30 to 80 wt %, and particularly preferably 40 to 70 wt % of the amount of the composition without that of solvent (F). When the proportion of the phenolic resin (A) is within the above range, the resin compositions can give a film that exhibits a sufficient developability by an alkaline aqueous solution.

(B) Compound having Quinonediazido Group:

The compound having a quinonediazido group (B) (hereinafter referred to as the "quinonediazide compound (B)") used in the invention is an ester formed between either 1,2-naphthoquinonediazido-4-sulfonic acid or 1,2-naphthoquinonediazido-5-sulfonic acid and a compound having at least one phenolic hydroxyl group. The compound having at least one phenolic hydroxyl group is not particularly limited; preferably it has a structure represented by any of the following formulae:

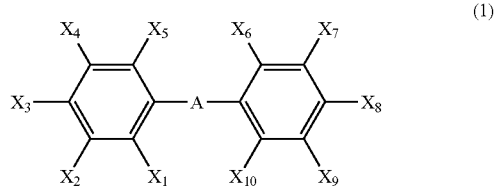

wherein $X_1$ to $X_{10}$ independently denote a hydrogen atom, an alkyl group of 1 to 4 carbon atoms, an alkoxy group of 1 to 4 carbon atoms or a hydroxyl group provided, however, that at least one of $X_1$ to $X_5$ is a hydroxyl group; and A is a single bond, O, S, $CH_2$, $C(CH_3)_2$, $C(CF_3)_2$, C=O or $SO_2$;

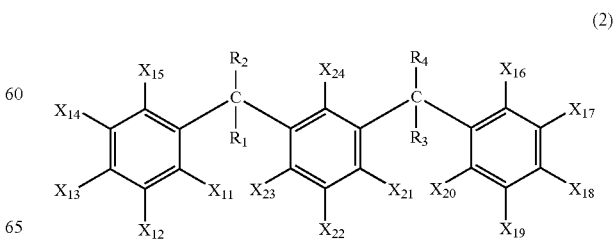

wherein $X_{11}$ to $X_{24}$, which may be the same or different, are the same definition as $X_1$ to $X_{10}$ provided, however, that least one of $X_{11}$ to $X_{15}$ is a hydroxyl group; and $R_1$ to $R_4$ independently denote a hydrogen atom or an alkyl group of 1 to 4 carbon atoms;

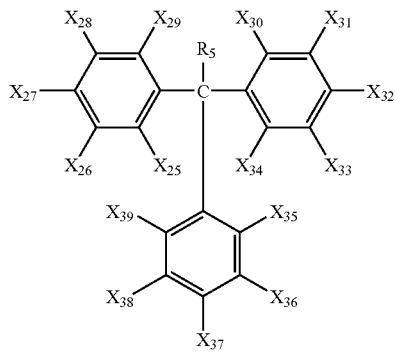

(3)

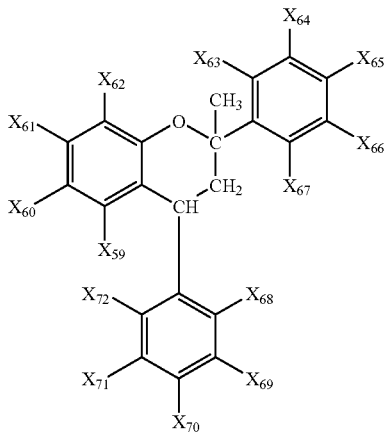

(5)

wherein $X_{25}$ to $X_{39}$, which may be the same or different, are the same definition as $X_1$ to $X_{10}$ provided, however, that at least one of $X_{25}$ to $X_{29}$ is a hydroxyl group and that at least one of $X_{30}$ to $X_{34}$ is a hydroxyl group; and $R_5$ denotes a hydrogen atom or an alkyl group of 1 to 4 carbon atoms;

wherein $X_{59}$ to $X_{72}$, which may be the same or different, are the same definition as $X_1$ to $X_{10}$ provided, however, that at least one of $X_{59}$ to $X_{62}$ is a hydroxyl group and that at least one of $X_{63}$ to $X_{67}$ is a hydroxyl group.

Examples of the quinonediazide compound (B) include esters of either 1,2-naphthoquinonediazido-4-sulfonic acid or 1,2-naphthoquinonediazido-5-sulfonic acid with any of 4,4'-dihydroxydiphenylmethane, 4,4'-dihydroxydiphenylether, 2,3,4-trihydroxybenzophenone, 2,3,4,4'-tetrahydroxybenzophenone, 2,3,4,2',4'-pentahydroxybenzophenone, tris(4-hydroxyphenyl)methane, tris(4-hydroxyphenyl)ethane, 1,1-bis(4-hydroxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, and 1,1-bis(4-hydroxyphenyl)-1-[4-{1-(4-hydroxyphenyl)-1-methylethyl}phenyl]ethane.

Desirably, the resin compositions contain the quinonediazide compound (B) at 10 to 50 parts by weight, and preferably 15 to 30 parts by weight based on 100 parts by weight of the phenolic resin (A) (or the total amount of the phenolic resin (A) and the phenolic compound (a) when they are used in combination) When the proportion of the quinonediazide compound (B) falls below the lower limit, the retention percentage of film in non-photoexposed areas may be lowered and the image may not be obtained accurately as designed with a pattern mask. When the proportion of the quinonediazide compound (B) exceeds the upper limit, the pattern may be deteriorated and the composition may foam during the curing process.

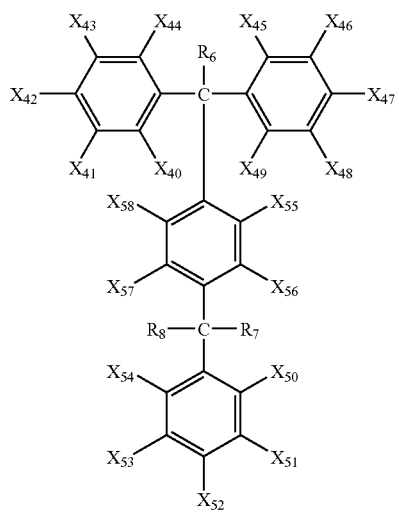

(4)

(C) Crosslinked Fine Particles:

The crosslinked fine particles (C) may be any particles provided that the polymer making up the particles has a Tg of not higher than 0° C. Preferably, the crosslinked fine particles are obtained by copolymerizing a crosslinkable monomer (hereinafter referred to as the "crosslinkable monomer") which has at least two unsaturated polymerizwherein $X_{40}$ to $X_{58}$, which may be the same or different, are the same definition as $X_1$ to $X_{10}$ provided, however, that at least one of $X_{40}$ to $X_{44}$ is a hydroxyl group, that at least one of $X_{45}$ to $X_{49}$ is a hydroxyl group and that at least one of $X_{50}$ to $X_{54}$ is a hydroxyl group; and $R_6$ to $R_8$ independently denote a hydrogen atom or an alkyl group of 1 to 4 carbon atoms;

able groups with one or more different monomer(s) (hereinafter referred to as the "different monomer(s)") which is selected so that the resultant copolymer for making up the crosslinked fine particles (C) has a Tg of not higher than 0° C. Preferably, the different monomer has a functional group other than polymerizable groups, such as a carboxyl, epoxy, amino, isocyanate or hydroxyl group, and is such that the resulting copolymer for making up the crosslinked fine particles (C) has a Tg of not higher than 0° C.

Exemplary crosslinkable monomers include compounds with plural polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate and polypropylene glycol di(meth)acrylate. On these, divinylbenzene is preferable.

In preparing the crosslinked fine particles (C), the crosslinkable monomer is preferably used at 1 to 20 wt %, and more preferably 2 to 10 wt % based on the total amount of all the monomers to be copolymerized.

Examples of the different monomers include:

diene compounds such as butadiene, isoprene, dimethylbutadiene, chloroprene and 1,3-pentadiene;

unsaturated nitrile compounds such as (meth)acrylonitrile, α-chloroacrylonitrile, α-chloromethylacrylonitrile, α-methoxyacrylonitrile, α-ethoxyacrylonitrile, nitrile crotonate, nitrile cinnamate, dinitrile itaconate, dinitrile maleate and dinitrile fumarate;

unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonic amide and cinnamic amide;

(meth)acrylates such as methyl(meth)acrylate, ethyl(meth)acrylate, propyl(meth)acrylate, butyl(meth)acrylate, hexyl(meth)acrylate, lauryl(meth)acrylate, polyethylene glycol(meth)acrylate and polypropylene glycol(meth)acrylate;

aromatic vinyl compounds such as styrene, α-methylstyrene, o-methoxystyrene, p-hydroxystyrene and p-isopropenylphenol;

epoxy(meth)acrylates resulting from the reaction of diglycidyl ether of bisphenol A, diglycidyl ether of glycol, etc. with (meth)acrylic acid, hydroxyalkyl(meth)acrylate, etc.; and urethane(meth)acrylates resulting from the reaction of hydroxyalkyl(meth)acrylate with polyisocyanate;

unsaturated compounds having an epoxy group such as glycidyl(meth)acrylate and (meth)allyl glycidyl ether;

unsaturated acid compounds such as (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate;

unsaturated compounds having an amino group such as dimethylamino(meth)acrylate and diethylamino(meth)acrylate;

unsaturated compounds having an amido group such as (meth)acrylamide and dimethyl(meth)acrylamide; and unsaturated compounds having a hydroxyl group such as hydroxyethyl(meth)acrylate, hydroxypropyl(meth)acrylate and hydroxybutyl(meth)acrylate.

Of these different monomers, butadiene, isoprene, (meth)acrylonitrile, alkyl(meth)acrylates, styrene, p-hydroxystyrene, p-isopropenylphenol, glycidyl (meth)acrylate, (meth)acrylic acid, hydroxyalkyl(meth)acrylates, etc. may be preferably used.

As the different monomer, at least one kind of diene compounds, particularly butadiene, is preferably used. Desirably, the diene compound is used at 20 to 80 wt %, and preferably 30 to 70 wt % based on the total amount of all the monomers to be copolymerized.

The crosslinked fine particles (C) can be obtained as rubber-like soft fine particles when the diene compound such as butadiene has been copolymerized in the above proportion based on the total amount of all the monomers. Further, the above amount of the different monomer leads to excellent crack resistance and durability of the resulting cured film.

Desirably, the crosslinked fine particles (C) have a mean particle diameter of 30 to 500 nm, preferably 40 to 200 nm, and more preferably 50 to 120 nm. The diameters of the crosslinked fine particles (C) may be controlled by any method. For example, in the case where the particles (C) are synthesized by emulsion polymerization, the particle diameters can be controlled by, but not limited thereto, adjusting the amount of emulsifying agent to regulate the number of micells formed during the emulsion polymerization.

Desirably, the crosslinked fine particles (C) are used at 1 to 50 parts by weight, and preferably 5 to 30 parts by weight based on 100 parts by weight of the phenolic resin (A) (or the total amount of the phenolic resin (A) and the phenolic compound (a) when they are used in combination). When the proportion of the crosslinked fine particles (C) falls below the lower limit, the resultant cured film may have poor thermal shock properties. Whereas the proportion over the upper limit may result in deterioration of resolution and heat resistance of the cured film; further it may cause lowering of compatibility and dispersion properties of the particles with other components.

(D) Compound Containing at Least Two Alkyletherified Amino Groups in Molecule (Curing Agent):

The compound containing at least two alkyletherified amino groups in the molecule (D) (hereinafter referred to as the "curing agent (D)") works as a crosslinking agent (curing agent) which reacts with the phenolic resin (A) Examples of the curing agent (D) include nitrogen-containing compounds, such as (poly)methylolated melamine, (poly)methylolated glycoluril, (poly)methylolated benzoguanamine and (poly)methylolated urea, in which all or part of active methylol groups have been alkyletherified. Exemplary alkyl groups include methyl, ethyl, butyl and mixtures thereof. The curing agent may contain an oligomer component resulting from the partial self-condensation of the nitrogen-containing compound Examples of such curing agents include hexamethoxymethylated melamine, hexabutoxymethylated melamine, tetramethoxymethylated glycoluril and tetrabutoxymethylated glycoluril. These curing agents (D) may be used either singly or in combination of two or more kinds.

Desirably, the curing agent (D) is used at 1 to 100 parts by weight, and preferably 5 to 50 parts by weight based on 100 parts by weight of the phenolic resin (A) (or the total amount of the phenolic resin (A) and the phenolic compound (a) they are used in combination) When the proportion of the curing agent (D) falls below the lower limit, the curing cannot be effected sufficiently to result in lowered electrical insulating properties of the cured product. Whereas the proportion over the upper limit may lead to deteriorated patterning properties or heat resistance.

(E) Thermal Acid Generator:

The thermal acid generator (E) (hereinafter referred to as the "acid generator (E)") used in the invention may be any compound that generates an acid when heated at appropriate temperatures, e.g. at 50 to 250° C. Examples thereof include, but not limited thereto, sulfonium salts, diazonium salts, halogen-containing compounds and sulfonate compounds. The generated acid works as a catalyst to accelerate the reaction between the alkylether groups in the curing agent (D) and the phenolic resin (A).

Examples of the acid generator (E) include benzylmethylphenylsulfonium hexafluoroantimonate, benzylmethylphenylsulfonium hexafluorophosphate, benzylmethylphenylsulfonium tetrafluoroborate, benzylmethylphenylsulfonium trifluoromethanesulfonate, benzyl(4-hydroxyphenyl)methylsulfonium hexafluoroantimonate, benzyl(4-hydroxyphenyl)methylsulfonium hexafluorophosphate, benzyl(4-hydroxyphenyl)methylsulfonium tetrafluoroborate, benzyl(4-hydroxyphenyl)methylsulfonium trifluoromethanesulfonate, benzenediazonium hexafluoroantimonate, benzenediazonium hexafluorophosphate, benzenediazonium tetrafluoroborate, benzenediazonium trifluoromethanesulfonate, naphthalenediazonium hexafluoroantimonate, and naphthalenediazonium trifluoromethanesulfonate.

Desirably, the acid generator (E) is used at 0.1 to 10 parts by weight, and preferably 0.5 to 5 parts by weight based on 100 parts by weight of the phenolic resin (A) (or the total amount of the phenolic resin (A) and the phenolic compound (a) when they are used in combination). When the proportion of the acid generator (E) falls below the lower limit, the resultant cured product may have poor solvent resistance. Whereas the proportion over the upper limit may result in lowering of electrical insulating properties.

(F) Solvent:

The solvent (F) is incorporated in the resin compositions to improve handling properties or to control the viscosity or storage stability of the compositions. Examples of the solvent (F) include, but not particularly limited thereto:

ethylene glycol monoalkylether acetates such as ethylene glycol monomethylether acetate and ethylene glycol monoethylether acetate;

propylene glycol monoalkylethers such as propylene glycol monomethylether, propylene glycol monoethylether, propylene glycol monopropylether and propylene glycol monobutylether;

propylene glycol dialkylethers such as propylene glycol dimethylether, propylene glycol diethylether, propylene glycol dipropylether and propylene glycol dibutylether;

propylene glycol monoalkylether acetates such as propylene glycol monomethylether acetate, propylene glycol monoethylether acetate, propylene glycol monopropylether acetate and propylene glycol monobutylether acetate;

cellosolves such as ethyl cellosolve and butyl cellosolve;

carbitols such as butyl carbitol;

lactates such as methyl lactate, ethyl lactate, n-propyl lactate and isopropyl lactate;

aliphatic carboxylates such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate;

other esters such as methyl 3-methoxypropionate, ethyl 3-methoxypropionate, methyl 3-ethoxypropionate, ethyl 3-ethoxypropionate, methyl pyruvate and ethyl pyruvate;

aromatic hydrocarbons such as toluene and xylene;

ketones such as 2-heptanone, 3-heptanone, 4-heptanone and cyclohexanone;

amides such as N-dimethylformamide, N-methylacetamide, N,N-dimethylacetamide and N-methylpyrrolidone; and lactones such as γ-butyrolactone.

These solvents (F) may be used either singly or in combination of two or more kinds.

(G) Another Additive:

The aforesaid resin compositions may further contain another additive, such as an epoxy compound, an adhesion auxiliary or a leveling agent. Exemplary epoxy compounds include novolak epoxy resins, bisphenol epoxy resins, alicyclic epoxy resins and aliphatic epoxy resins. These additives may be used within limits not detrimental to the characteristics of the compositions.

Cured Products

The first positive photosensitive insulating resin composition comprises the phenolic resin (A), quinonediazide compound (B), crosslinked fine particles (C), curing agent (D), solvent (F) and optionally another additive (G). This resin composition has an excellent resolution, and a cured product given by the resin composition is excellent in electrical insulating, thermal shock and adhesive properties and in cure shrinkage.

The second positive photosensitive insulating resin composition comprises the phenolic resin (A), quinonediazide compound (B), crosslinked fine particles (C), curing agent (D), acid generator (E), solvent (F) and optionally another additive (G). This resin composition has an excellent resolution, and a cured product given by the resin composition is excellent in electrical insulating, thermal shock and adhesive properties, and in cure shrinkage and solvent resistance.

Thus, these resin compositions can be suitably used as materials for the production of interlayer insulation films and surface protection films for semiconductor elements.

The resin composition is applied onto a substrate such as a silicon wafer on which wiring patterns have been provided, and the solvent etc. is evaporated by drying the applied resin composition to form a film. Thereafter, the film is photoexposed through a photomask of desired pattern, and the exposed film is developed with an alkaline developer. As a result of the development, the photoexposed area is dissolved and removed to give the film which have become the desired pattern. Further, the film is heated to develop insulating properties, and thereby a cured film can be produced.

The above application of the composition onto the substrate can be accomplished by dip coating, spray coating, bar coating, roll coating, spin coating, curtain coating or the like. The thickness of the film can be controlled appropriately by selecting the application method and adjusting the solid concentration or viscosity of the composition.

Exemplary radiations employable for the above exposure include an ultraviolet ray, an electron beam and a laser beam emitted from a low-pressure mercury lamp, a high-pressure mercury lamp, a metal halide lamp, a g-line stepper and an i-line stepper. The dose can be appropriately determined in accordance with the radiation source used or the thickness of the resin film. In the case of ultraviolet rays radiated from high-pressure mercury lamps, the dose is about 1,000 to 20,000 J/m$^2$ for the film thickness of 5 to 50 μm.

Subsequently, the photoexposed layer is developed with an alkaline developer to dissolve the photoexposed area and remove it to form a desired pattern. Exemplary developing methods include shower development, spray development, immersion development and puddle development. The development is usually carried out at 20 to 40° C. for about 1 to 10 minutes.

Examples of the alkaline developer include alkaline aqueous solutions of about 1 to 10 wt % of an alkaline compound, such as of sodium hydroxide, potassium hydroxide, ammonia water, tetramethylammonium hydroxide or choline. The alkaline aqueous solution may be mixed with an appropriate amount of water-soluble organic solvent, such as methanol or ethanol, or a surfactant. The above development with the alkaline developer is followed by water washing and drying.

The formed pattern is then cured by heat treatment, so that the resulting cured film will fully function as an insulation film. In the case of the second composition, the acid generator (E) is decomposed on heat treatment to generate an acid. By the catalysis of this acid, a curing reaction between the curing agent (D) and the phenolic resin (A) is accelerated. The curing conditions are not particularly limited and depend on the objective use of the cured product; for example the film may be cured by heating at 100 to 250° C. for 30 minutes to 10 hours. It is also possible to carry out the heat treatment in two stages in order to effect the curing sufficiently or to avoid deformation of the resulting pattern. For example, the curing may be carried out in a manner such that the resultant pattern is heated at 50 to 100° C. for 10 minutes to 2 hours in the first stage and further at 100 to 250° C. for 20 minutes to 8 hours in the second stage. With the above curing conditions, the heating may be conducted by a conventional oven, an infrared oven or the like.

INDUSTRIAL APPLICABILITY

The positive photosensitive insulating resin compositions of the invention have a good resolution and can give cured products that are excellent in electrical insulating, thermal shock and adhesive properties, particularly excellent in insulating and thermal shock properties.

EXAMPLES

The present invention will be hereinafter described in detail by the following Examples, but it should be construed that the invention is in no way limited to those Examples. Hereinafter, the "part(s)" is by weight unless otherwise mentioned.

The following is a list of the components used in Examples and Comparative Examples. The cured products obtained in these embodiments were subjected to the evaluation of properties in accordance with the procedures given below.

<Components>

Phenolic Resin (A):
A-1: cresol novolak resin prepared from m-cresol and p-cresol in 60/40 molar ratio (weight-average molecular weight in terms of polystyrene: 8,700)
A-2: cresol novolak resin prepared from m-cresol and p-cresol in 50/50 molar ratio (weight-average molecular weight in terms of polystyrene: 7,500)
A-3: polyhydroxystyrene (trade name: MARUKA LYNCUR S-2P available from Maruzen Petrochemical Co., Ltd.)

Phenolic Compound (a):
a-1: 1,1-bis(4-hydroxyphenyl)-1-[4-{1-(4-hydroxyphenyl)-1-methylethyl}phenyl]ethane Quinonediazide Compound (B):
B-1: condensate formed between 1,1-bis(4-hydroxyphenyl)-1-[4-{1-(4-hydroxyphenyl)-1-methylethyl}phenyl]ethane and 1,2-naphthoquinonediazido-5-sulfonic acid in an average molar ratio of 1/2.0.
B-2: condensate formed between 1,1-bis(4-hydroxyphenyl)-1-phenylethane and 1,2-naphthoquinonediazido-5-sulfonic acid in an average molar ratio of 1/1.5.

Crosslinked Fine Particles (C):
C-1: butadiene/hydroxybutyl methacrylate/methacrylic acid/divinylbenzene=60/32/6/2 (wt %), mean particle diameter=65 nm Curing Agent (D):
D-1: hexamethoxymethylated melamine (trade name: CYMEL 300 available from Mitsui Cytec, Ltd.)
D-2: tetramethoxymethyl glycoluril (trade name: CYMEL 1174 available from Mitsui Cytec, Ltd.)

Acid Generator (E):
E-1: benzyl(4-hydroxyphenyl)methylsulfonium hexafluoroantimonate
E-2: benzyl(4-hydroxyphenyl)methylsulfonium hexafluorophosphate Solvent (F):
F-1: ethyl lactate
F-2: 2-heptanone Another Additive (G)
G-1: diethylene glycol diglycidyl ether
G-2: SAN-AID SI-150 (available from SANSHIN CHEMICAL IND. CO., LTD.)

<Evaluation Procedure>

Resolution:
The photosensitive insulating resin composition was applied onto a 6-inch silicon wafer by a spin coating. The applied resin composition was heated on a hot plate at 100° C. for 5 minutes to prepare a uniform film 10 µm thick. The film was then irradiated through a pattern mask with ultraviolet rays emitted from a high pressure mercury lamp using an aligner MA-150 (available from Suss Microtec). The dose is between 3,000 and 10,000 J/m$^2$ at 350 nm. The exposed film was then developed by being immersed in an aqueous solution of 2.38 wt % of tetramethylammonium hydroxide at 23° C. for 2 minutes. The film was thereafter washed with ultrapure water for 1 minute to form a pattern. The resolution was evaluated based on the minimum size of the obtained pattern.

Electrical Insulating Properties (Volume Resistivity):
The photosensitive insulating resin composition was applied onto an SUS substrate. The applied resin composition was heated on a hot plate at 100° C. for 5 minutes to prepare a uniform resin film 10 µm thick. The film was further heated in a convection oven at 170° C. for 2 hours to give a cured film. The cured film was treated with a pressure cooker tester (ESPEC CORP.) for 168 hours under the conditions of 121° C., 100% humidity and 2.1 atm. The interlayer volume resistivity was measured before and after the above treatment. The results were compared to each other to confirm the resistance properties.

Figure 2:
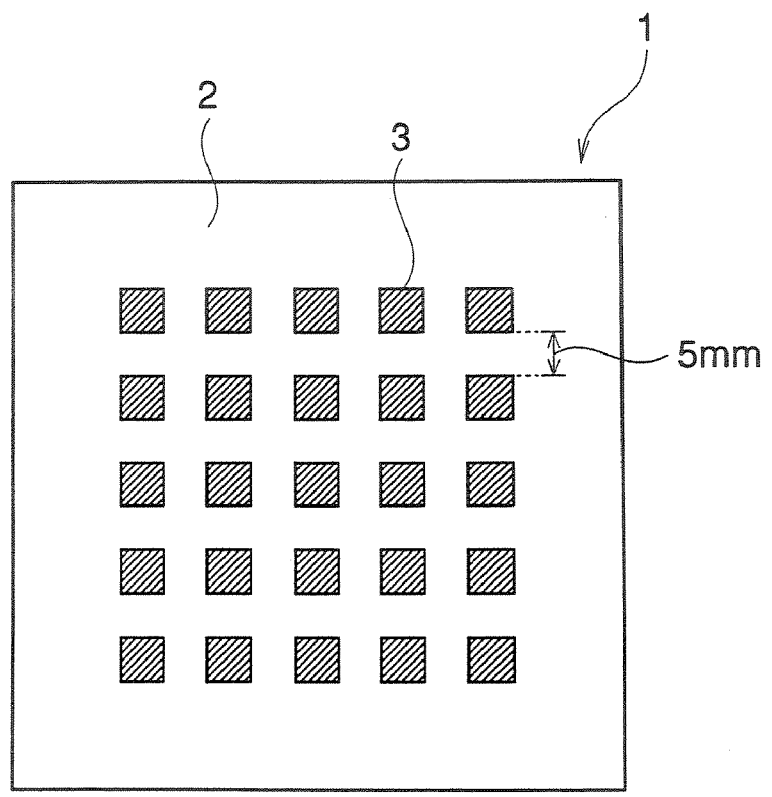
FIG. 2 is a top view of the evaluation sample shown in FIG. 1.

Thermal Shock Properties:
The photosensitive insulating resin composition was applied onto an evaluation substrate 1 for testing the thermal shock properties. As shown in FIGS. 1 and 2, the evaluation substrate 1 consisted of a substrate 2 and a pattern of copper foil 3. The applied resin composition was then heated on a hot plate at 100° C. for 5 minutes to prepare an evaluation sample. The evaluation sample had a resin film 10 μm thick on the conductor of the evaluation substrate 1. The resin coating was further heated in a convection oven at 170° C. for 2 hours to give a cured film. The evaluation sample was thereafter subjected to a thermal shock test with a thermal shock tester (ESPEC CORP.) In the test, a cycle of −55° C./30 minutes and 150° C./30 minutes was repeated until a crack or a like defect was caused in the cured film. The thermal shock properties were determined based on the number of cycles.

Adhesive Properties:

The photosensitive insulating resin composition was applied onto an $SiO_2$-spattered silicon water. The applied resin composition was heated on a hot plate at 100° C. for 5 minutes to prepare a sample having a uniform resin film 10 μm thick. The film was further heated in a convection oven at 170° C. for 2 hours to give a cured film. The cured film was thereafter treated with a pressure cooker tester (ESPEC CORP.) for 168 hours under the conditions of 121° C., 100% humidity and 2.1 atm. The adhesive properties before and after the above treatment were tested by a cross cut (adhesion) test in accordance with JIS K5400.

Cure Shrinkage:

The photosensitive insulating resin composition was applied onto a 6-inch silicon wafer by a spin coating. The applied resin composition was heated on a hot plate at 100° C. for 5 minutes to prepare a sample having uniform film. At this stage, the thickness of the resin film was measured as the thickness (A). Thereafter the resin film was further heated in a convection oven at 170° C. for 2 hours to give a cured film. The thickness of the cured film was measured as the thickness (B) The cure shrinkage was calculated by the formula:

Cure shrinkage=$\{1-(B)/(A)\} \times 100$

Solvent Resistance:

The photosensitive insulating resin composition was applied onto a 6-inch silicon wafer by a spin coating. The applied resin composition was heated on a hot plate at 100° C. for 5 minutes to prepare a sample having a uniform film 10 μm thick. Thereafter the film was further heated in a convection oven at 170° C. for 2 hours to give a cured film. The sample with the cured film was soaked in isopropyl alcohol at 60° C. for 10 minutes. Then the surface of the cured film was observed with a light microscope to evaluate the surface condition based on the following criteria:

AA: the surface was intact

BB: the surface had been whitened or decayed

First Positive Photosensitive Insulating Resin Composition and Cured Product Thereof Examples 1-5

The phenolic resin (A), the phenolic compound (a), the quinonediazide compound (B), the crosslinked fine particles (C) the curing agent (D) and the another additive (G) were dissolved in the solvent (F) in the mixing ratio listed in Table 1 to prepare a resin composition. The resin composition was then subjected to the measurements of the properties in the manners described hereinabove. The results are shown in Table 2.

Comparative Examples 1-4

The phenolic resin (A), the quinonediazide compound (B), the crosslinked fine particles (C), the curing agent (D) and the another additive (G) were dissolved in the solvent (F) in the mixing ratio listed in Table 1 to prepare a resin composition. The resin composition was then subjected to the measurements of the properties in the manners described hereinabove. The results are shown in Table 2.

TABLE 1

| | Phenolic resin (A) | | Phenolic compound (a) | | Quinonediazide compound (B) | | Crosslinked fine particles (C) | | Curing agent (D) | | Solvent (F) | | Another additive (G) | |
|---|---|---|---|---|---|---|---|---|---|---|---|---|---|---|
| | Type | Parts | Type | Parts | Type | Parts | Type | Parts | Type | Parts | Type | Parts | Type | Parts |
| Ex. 1 | A-1 | 100 | — | — | B-1 | 20 | C-1 | 10 | D-1 | 15 | F-1 | 145 | — | — |
| Ex. 2 | A-1 | 90 | a-1 | 10 | B-1 | 20 | C-1 | 10 | D-1 | 10 | F-1 | 140 | G-1 | 5 |
| Ex. 3 | A-2 | 100 | — | — | B-2 | 25 | C-1 | 10 | D-2 | 20 | F-1 | 150 | G-2 | 2 |
| Ex. 4 | A-1/A-3 | 90/10 | — | — | B-1 | 25 | C-1 | 10 | D-1 | 20 | F-2 | 140 | G-1 | 5 |
| Ex. 5 | A-2 | 90 | a-1 | 10 | B-2 | 20 | C-1 | 10 | D-1 | 20 | F-1 | 150 | G-1/G-2 | 5/2 |
| Comp. Ex. 1 | A-1 | 100 | — | — | B-1 | 20 | — | — | — | — | F-1 | 135 | — | — |
| Comp. Ex. 2 | A-1 | 100 | — | — | B-1 | 20 | C-1 | 10 | — | — | F-1 | 130 | — | — |
| Comp. Ex. 3 | A-1 | 100 | — | — | B-1 | 20 | — | — | D-1 | 15 | F-1 | 135 | — | — |
| Comp. Ex. 4 | A-1 | 100 | — | — | B-1 | 20 | — | — | D-1 | 15 | F-1 | 135 | G-1 | 5 |

TABLE 2

| | Resolution (μm) | Volume resistivity (Ω·cm) before treatment | Volume resistivity (Ω·cm) after treatment | Thermal shock properties (cycles) | Adhesive properties before treatment | Adhesive properties after treatment | Cure shrinkage (%) |
|---|---|---|---|---|---|---|---|
| Ex. 1 | 10 | $3 \times 10^{15}$ | $5 \times 10^{14}$ | 800 | 100/100 | 90/100 | 12 |
| Ex. 2 | 5 | $6 \times 10^{15}$ | $8 \times 10^{14}$ | 800 | 100/100 | 100/100 | 13 |
| Ex. 3 | 10 | $5 \times 10^{15}$ | $7 \times 10^{14}$ | 1,000 | 100/100 | 100/100 | 11 |
| Ex. 4 | 5 | $2 \times 10^{15}$ | $3 \times 10^{14}$ | 800 | 100/100 | 90/100 | 12 |
| Ex. 5 | 5 | $7 \times 10^{15}$ | $1 \times 10^{15}$ | 1,000 | 100/100 | 100/100 | 12 |
| Comp. Ex. 1 | 10 | $7 \times 10^{14}$ | $3 \times 10^{9}$ | 100 | 80/100 | 0/100 | 10 |
| Comp. Ex. 2 | 15 | $8 \times 10^{14}$ | $3 \times 10^{10}$ | 200 | 80/100 | 0/100 | 10 |
| Comp. Ex. 3 | 10 | $4 \times 10^{15}$ | $4 \times 10^{14}$ | 400 | 90/100 | 60/100 | 11 |
| Comp. Ex. 4 | 5 | $5 \times 10^{15}$ | $1 \times 10^{14}$ | 300 | 100/100 | 50/100 | 12 |

Second Positive Photosensitive Insulating Resin Composition and Cured Product Thereof Examples 6-10

The phenolic resin (A), the phenolic compound (a), the quinonediazide compound (B), the crosslinked fine particles (C) the curing agent (D) and the acid generator (E) were dissolved in the solvent (F) in the mixing ratio listed in Table 3 to prepare a resin composition. The resin composition was then subjected to the measurements of the properties in the manners described hereinabove. The results are shown in Table 4.

Comparative Examples 5-9

The phenolic resin (A), the quinonediazide compound (B), the crosslinked fine particles (C), the curing agent (D) and the acid generator (E) were dissolved in the solvent (F) in the mixing ratio listed in Table 3 to prepare a resin composition. The resin composition was then subjected to the measurements of the properties in the manners described hereinabove. The results are shown in Table 4.

TABLE 3

| | Phenolic resin (A) Type | Phenolic resin (A) Parts | Phenolic compound (a) Type | Phenolic compound (a) Parts | Quinonediazide compound (B) Type | Quinonediazide compound (B) Parts | Crosslinked fine particles (C) Type | Crosslinked fine particles (C) Parts | Curing agent (D) Type | Curing agent (D) Parts | Acid generator (E) Type | Acid generator (E) Parts | Solvent (F) Type | Solvent (F) Parts |
|---|---|---|---|---|---|---|---|---|---|---|---|---|---|---|
| Ex. 6 | A-1 | 100 | — | — | B-1 | 20 | C-1 | 10 | D-1 | 15 | E-1 | 2 | F-1 | 147 |
| Ex. 7 | A-2 | 100 | — | — | B-1 | 23 | C-1 | 12 | D-1 | 15 | E-1 | 2 | F-1 | 152 |
| Ex. 8 | A-1 | 90 | a-1 | 10 | B-2 | 20 | C-1 | 10 | D-2 | 20 | E-1 | 3 | F-1 | 153 |
| Ex. 9 | A-1/A-3 | 90/10 | — | — | B-1 | 20 | C-1 | 10 | D-1 | 20 | E-1 | 2 | F-2 | 130 |
| Ex. 10 | A-1 | 100 | — | — | B-1 | 20 | C-1 | 10 | D-1 | 20 | E-2 | 2 | F-1 | 152 |
| Comp. Ex. 5 | A-1 | 100 | — | — | B-1 | 20 | C-1 | 10 | D-1 | 15 | — | — | F-1 | 145 |
| Comp. Ex. 6 | A-1 | 100 | — | — | B-1 | 20 | C-1 | 10 | — | — | — | — | F-1 | 130 |
| Comp. Ex. 7 | A-1 | 100 | — | — | B-1 | 20 | — | — | D-1 | 15 | — | — | F-1 | 135 |
| Comp. Ex. 8 | A-1 | 100 | — | — | B-1 | 20 | — | — | D-1 | 15 | E-1 | 2 | F-1 | 137 |
| Comp. Ex. 9 | A-1 | 100 | — | — | B-1 | 20 | C-1 | 10 | — | — | E-1 | 2 | F-1 | 132 |

TABLE 4

| | Resolution (μm) | volume resistivity (Ω·cm) before treatment | volume resistivity (Ω·cm) after treatment | Thermal shock properties (cycles) | Adhesive properties before treatment | Adhesive properties after treatment | Solvent resistance | Cure shrinkage (%) |
|---|---|---|---|---|---|---|---|---|
| Ex. 6 | 10 | $2 \times 10^{15}$ | $7 \times 10^{14}$ | 800 | 100/100 | 100/100 | AA | 12 |
| Ex. 7 | 10 | $3 \times 10^{15}$ | $8 \times 10^{14}$ | 1,000 | 100/100 | 100/100 | AA | 12 |
| Ex. 8 | 5 | $2 \times 10^{15}$ | $6 \times 10^{14}$ | 800 | 100/100 | 100/100 | AA | 13 |
| Ex. 9 | 10 | $5 \times 10^{15}$ | $8 \times 10^{14}$ | 1,000 | 100/100 | 100/100 | AA | 12 |

TABLE 4-continued

| | Resolution (μm) | volume resistivity (Ω·cm) before treatment | volume resistivity (Ω·cm) after treatment | Thermal shock properties (cycles) | Adhesive properties before treatment | Adhesive properties after treatment | Solvent resistance | Cure shrinkage (%) |
|---|---|---|---|---|---|---|---|---|
| Ex. 10 | 10 | $6 \times 10^{15}$ | $2 \times 10^{15}$ | 800 | 100/100 | 100/100 | AA | 11 |
| Comp. Ex. 5 | 10 | $3 \times 10^{15}$ | $4 \times 10^{14}$ | 800 | 100/100 | 90/100 | BB | 12 |
| Comp. Ex. 6 | 15 | $8 \times 10^{14}$ | $3 \times 10^{10}$ | 200 | 80/100 | 0/100 | BB | 10 |
| Comp. Ex. 7 | 10 | $4 \times 10^{15}$ | $4 \times 10^{14}$ | 400 | 90/100 | 60/100 | BB | 11 |
| Comp. Ex. 8 | 10 | $5 \times 10^{15}$ | $7 \times 10^{14}$ | 600 | 90/100 | 80/100 | BB | 12 |
| Comp. Ex. 9 | 10 | $3 \times 10^{14}$ | $2 \times 10^{10}$ | 200 | 80/100 | 20/100 | BB | 10 |

What is claimed is:

1. A positive photosensitive insulating resin composition comprising:
   (A) an alkali soluble resin having a phenolic hydroxyl group,
   (B) a compound having a quinonediazido group,
   (C) crosslinked fine particles,
   (D) a compound containing at least two alkyletherified amino groups in the molecule,
   (B) a thermal acid generator, and
   (F) a solvent,
   wherein the thermal acid generator is at least one selected from the group consisting of benzylmethylphenylsulfonium hexafluoroantimonate, benzylmethylphenylsulfonium hexafluorophosphate, benzylmethylphenylsulfonium tetrafluoroborate, benzylmethylphenylsulfonium trifluoromethanesulfonate, benzyl (4-hydroxyphenyl)methylsulfonium hexafluoroantimonate, benzyl (4-hydroxyphenyl)methylsulfonium hexafluorophosphate, benzyl (4-hydroxyphenyl)methylsulfonium tetrafluoroborate, benzyl (4-hydroxyphenyl)methylsulfonium trifluoromethanesulfonate, benzenediazonium hexafluoroantimonate, benzenediazonium hexafluorophosphate, benzenediazonium tetrafluoroborate, benzenediazonium trifluoromethanesulfonate, naphthalenediazonium hexafluoroantimonate, and naphthalenediazonium trifluoromethanesulfonate.

2. The resin composition of claim 1, which contains on the basis of 100 parts by weight of the alkali soluble resin having a phenolic hydroxyl group (A):
   the compound having a quinonediazido group (B) at 10 to 50 parts by weight,
   the crosslinked fine particles (C) at 1 to 50 parts by weight,
   the compound containing at least two alkyletherified amino groups in the molecule (D) at 1 to 100 parts by weight, and
   the thermal acid generator (E) at 0.1 to 10 parts by weight.

3. The resin composition of claim 1, wherein the crosslinked fine particles (C) have a mean particle diameter of 30 to 500 nm.

4. A cured product obtained by curing the positive photosensitive insulating resin composition of claim 1.

5. The resin composition of claim 1, wherein the compound having a quinonediazido group is an ester formed from at least one of 1,2-naphthoquinonediazido-4-sulfonic acid and 1,2-naphthoquinonediazido-5-sulfonic acid and a compound having at least one phenolic group selected from the group consisting of

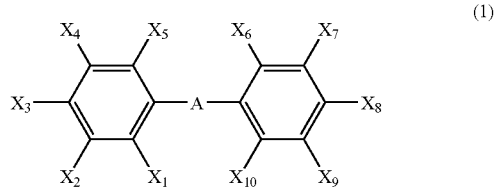

(1)

wherein $X_1$ to $X_{10}$ independently denote a hydrogen atom, an alkyl group of 1 to 4 carbon atoms, an alkoxy group of 1 to 4 carbon atoms or a hydroxyl group provided and at least one of $X_1$ to $X_5$ is a hydroxyl group, and A is a single bond, O, S, $CH_2$, $C(CH_3)_2$, $C(CF_3)_2$, C=O or $SO_2$;

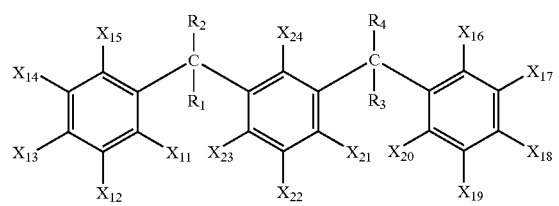

(2)

wherein $X_{11}$ to $X_{24}$, independently denote a hydrogen atom, an alkyl group of 1 to 4 carbon atoms, an alkoxy group of 1 to 4 carbon atoms or a hydroxyl group and at least one of $X_{11}$ to $X_{15}$ is a hydroxyl group; and $R_1$ to $R_4$ independently denote a hydrogen atom or an alkyl group of 1 to 4 carbon atoms;

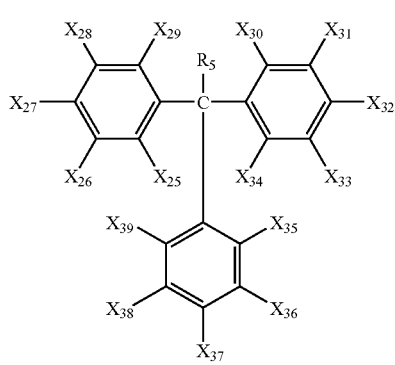
(3)

wherein $X_{25}$ to $X_{39}$, independently denote a hydrogen atom, an alkyl group of 1 to 4 carbon atoms, an alkoxy group of 1 to 4 carbon atoms or a hydroxyl group and at least one of $X_{25}$ to $X_{29}$ is a hydroxyl group and that at least one of $X_{30}$ to $X_{34}$ is a hydroxyl group, and $R_5$ denotes a hydrogen atom or an alkyl group of 1 to 4 carbon atoms;

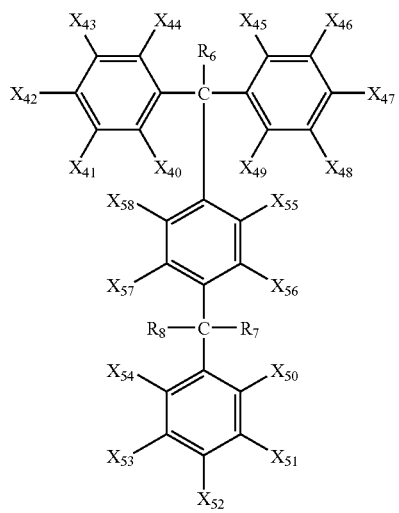
(4)

wherein $X_{40}$ to $X_{58}$, independently denote a hydrogen atom, an alkyl group of 1 to 4 carbon atoms, an alkoxy group of 1 to 4 carbon atoms or a hydroxyl group, at least one of $X_{40}$ to $X_{44}$ is a hydroxyl group, at least one of $X_{45}$ to $X_{49}$ is a hydroxyl group, and at least one of $X_{50}$ to $X_{54}$ is a hydroxyl group, and $R_6$ to $R_8$ independently denote a hydrogen atom or an alkyl group of 1 to 4 carbon atoms;

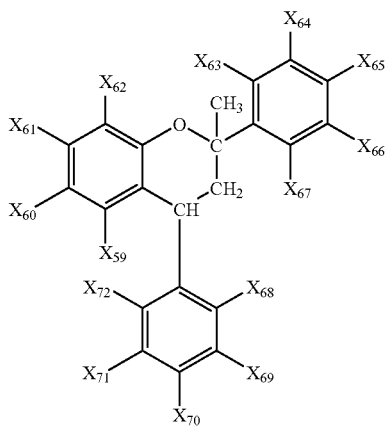
(5)

wherein $X_{59}$ to $X_{72}$, independently denote a hydrogen atom, an alkyl group of 1 to 4 carbon atoms, an alkoxy group of 1 to 4 carbon atoms or a hydroxyl group and at least one of $X_{59}$ to $X_{62}$ and at least one of $X_{63}$ to $X_{67}$ is a hydroxyl group.

6. The resin composition of claim 1, wherein the alkali soluble resin is at least one selected from the group consisting of a cresol novolak resin comprising bounded units of m-cresol and p-cresol, and a polyhydroxy styrene.

7. The resin composition of claim 1, wherein the compound having a quinonediazido group is at least one selected from the group consisting of a condensate of 1,1-bis(4-hydroxyphenyl)-1-[4-{1-(4-hydroxyphenyl)-1-methylethyl}phenol]ethane and 1,2-naphthoquinonediazido-5-sulfonic acid, and a condensate of 1,1-bis(4-hydroxyphenyl)-1-phenylethane and 1,2-naphthoquinonediazido-5-sulfonic acid.

8. The resin composition of claim 1, wherein the crosslinked fine particles are particles of a butadiene-hydroxybutyl/methacrylate/methacrylic acid/divinylbenzene polymer.

9. The resin composition of claim 1, wherein the compound containing at least two alkyletherified amino groups is selected from the group consisting of hexamethoxymethylated melamine and tetramethoxymethylated glycoluril.

10. The resin composition of claim 1, wherein the thermal acid generator is at least one selected from the group consisting of benzyl(4-hydroxyphenyl)methylsulfonium hexafluoroantimonate, benzyl(4-hydroxyphenyl)methylsulfonium hexafluorophosphate, and mixtures thereof.

11. The resin composition of claim 1, further comprising an epoxy compound.

12. The resin composition of claim 11, wherein the epoxy compound is at least one selected from the group consisting of a novolak epoxy resin, a bisphenol epoxy resin, an alicyclic epoxy resin and an aliphatic epoxy resin.

* * * * *